US008367926B2

(12) United States Patent
Peng et al.

(10) Patent No.: US 8,367,926 B2
(45) Date of Patent: Feb. 5, 2013

(54) ELECTRONIC APPARATUS AND COVER MECHANISM

(75) Inventors: Wen-Tang Peng, Taipei Hsien (TW); Chih-Ming Huang, Taipei Hsien (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 218 days.

(21) Appl. No.: 12/944,654

(22) Filed: Nov. 11, 2010

(65) Prior Publication Data

US 2012/0108088 A1    May 3, 2012

(30) Foreign Application Priority Data

Oct. 29, 2010 (TW) ................................ 99137119 A

(51) Int. Cl.

*H01B 3/16* (2006.01)
*H01J 5/00* (2006.01)
*H02G 3/14* (2006.01)
*H01R 13/44* (2006.01)
*H02B 5/00* (2006.01)

(52) U.S. Cl. ...... 174/17 R; 439/135; 439/136; 439/149; 439/562; 174/50; 174/50.52; 174/66; 361/616; 361/679.58

(58) Field of Classification Search ................ 174/17 R, 174/50.52, 59, 503, 483, 55, 66, 67; 439/135, 439/372, 149, 562, 563; 361/616, 679.58; 312/223.2

See application file for complete search history.

(56) References Cited

U.S. PATENT DOCUMENTS

| | | | | |
|---|---|---|---|---|
| 4,134,516 | A * | 1/1979 | Sullo | 220/242 |
| 4,159,858 | A * | 7/1979 | Toraya | 439/38 |
| 4,343,411 | A * | 8/1982 | Chesnut et al. | 220/242 |
| 4,660,912 | A * | 4/1987 | Tomek | 439/144 |
| 4,884,978 | A * | 12/1989 | Inaba et al. | 439/352 |
| 4,917,617 | A * | 4/1990 | Smith | 439/135 |
| 4,994,631 | A * | 2/1991 | Williams, Jr. | 174/67 |
| 5,064,969 | A * | 11/1991 | Bloom | 174/67 |
| D331,910 | S * | 12/1992 | Sato et al. | D13/133 |
| D360,190 | S * | 7/1995 | Fabich, Sr. | D13/156 |
| D365,803 | S * | 1/1996 | Boesel et al. | D13/139.8 |
| 5,628,648 | A * | 5/1997 | Higgins et al. | 439/489 |
| 6,106,321 | A * | 8/2000 | Yoshida et al. | 439/352 |
| 6,215,067 | B1 * | 4/2001 | Chen | 174/66 |
| 6,309,247 | B1 * | 10/2001 | Wang | 439/521 |
| 6,469,249 | B2 * | 10/2002 | Capella | 174/66 |
| 6,648,681 | B2 * | 11/2003 | Ushiro et al. | 439/557 |
| 7,495,900 | B2 * | 2/2009 | Shi et al. | 361/679.02 |
| 7,652,210 | B2 * | 1/2010 | White | 174/67 |
| 7,850,371 | B2 * | 12/2010 | Riley et al. | 385/77 |
| 2005/0185368 | A1 * | 8/2005 | Radtke | 361/681 |
| 2008/0057772 | A1 * | 3/2008 | Peng et al. | 439/372 |
| 2008/0316693 | A1 * | 12/2008 | Li et al. | 361/683 |
| 2009/0008123 | A1 * | 1/2009 | White | 174/67 |
| 2009/0266574 | A1 * | 10/2009 | Atkinson et al. | 174/67 |
| 2010/0054665 | A1 * | 3/2010 | Jones et al. | 385/59 |

* cited by examiner

*Primary Examiner* — Adrian S Wilson
*Assistant Examiner* — Abhishek Rathod
(74) *Attorney, Agent, or Firm* — Altis Law Group, Inc.

(57) ABSTRACT

An electronic apparatus includes an enclosure defining a connector port, and a cover mechanism. The cover mechanism includes a bracket mounted to the enclosure, a cover rotatably mounted to the bracket to cover or uncover the connector port. The cover includes an elastic lock. When the cover is rotated to cover the connector port, the elastic lock is engaged with a sidewall of the connector port.

9 Claims, 6 Drawing Sheets

ELECTRONIC APPARATUS AND COVER MECHANISM

BACKGROUND

1. Technical Field

The disclosure relates to electronic apparatuses, and particularly relates to an electronic apparatus with a cover mechanism covering connector ports defined in the electronic apparatus.

2. Description of Related Art

With the development of information technology, portable electronic devices such as digital cameras, video cameras, mobile phones, and personal digital assistants, are now in widespread use. Some electronic devices include external interfaces (e.g., universal serial bus (USB) interfaces) for being electrically connected to peripheral devices (e.g., printers), accessories (e.g., USB flash drives), or other electronic devices. However, when external interfaces are unused they may be left uncovered and at risk of contamination by dust and/or water.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of examples and not by way of limitation. It should be noted that references to "an" or "one" embodiment in this disclosure are not necessarily to the same embodiment, and such references mean at least one.

Figure 1:
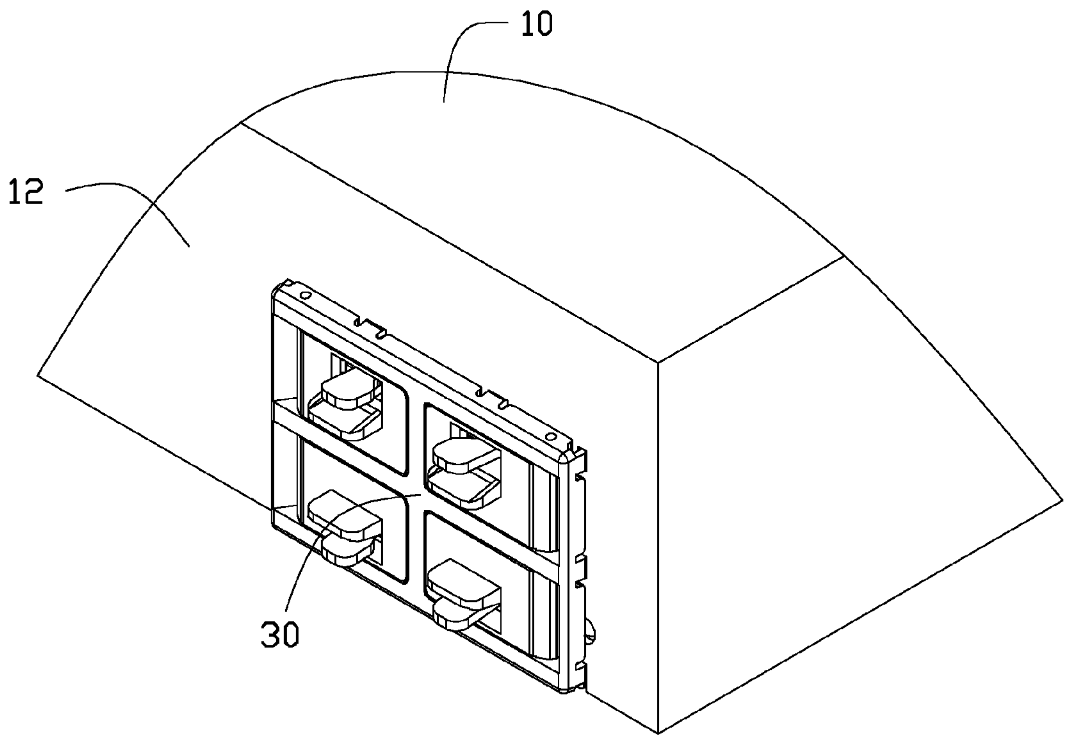
FIG. 1 is a partial, assembled, isometric view of an electronic apparatus, the electronic apparatus includes an enclosure, and a cover mechanism including a plurality of covers.
Figure 2:
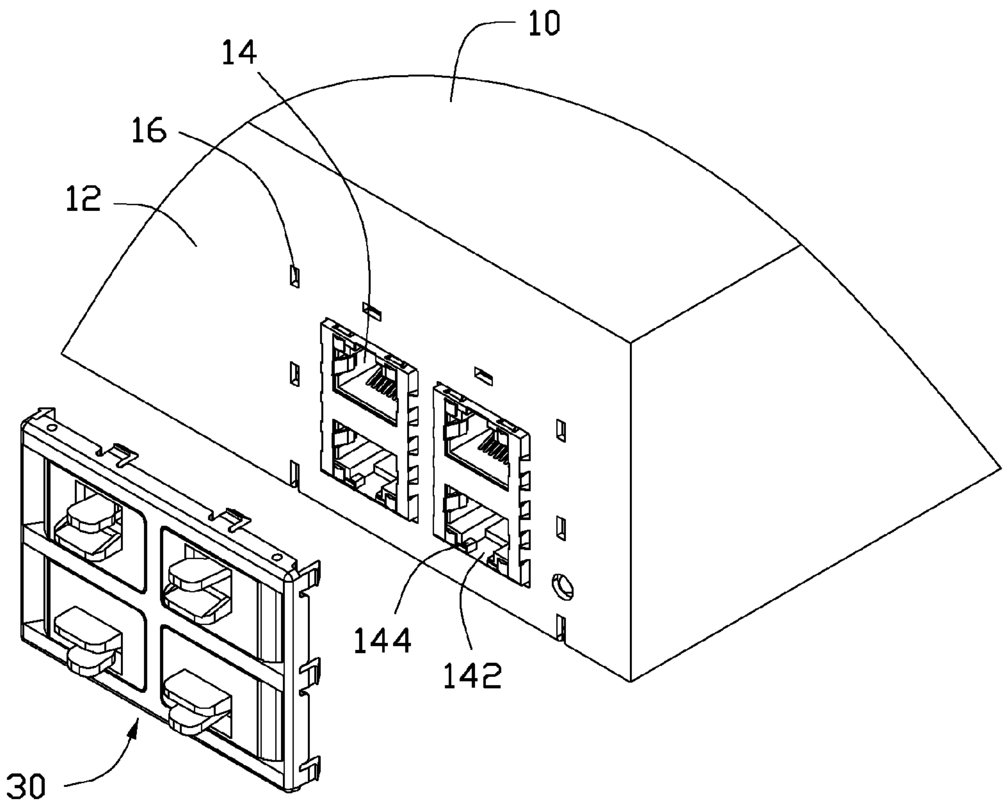
FIG. 2 is an exploded, isometric view of the electronic apparatus of FIG. 1.

Referring to FIGS. 1 and 2, an electronic apparatus includes an enclosure 10 and a cover mechanism 30 detachably mounted to the enclosure 10.

The enclosure 10 includes a side plate 12 and a plurality of connector ports 14 exposed through the side plate 12. The side plate 12 defines a plurality of fixing holes 16 surrounding the connector ports 14. In this embodiment, the enclosure 10 includes four connector ports 14. Two blocks 144 extend from opposite sides of each connector port 14, adjacent to the side plate 12, and towards each other but leaving a slot 142 defined therebetween.

Figure 3:
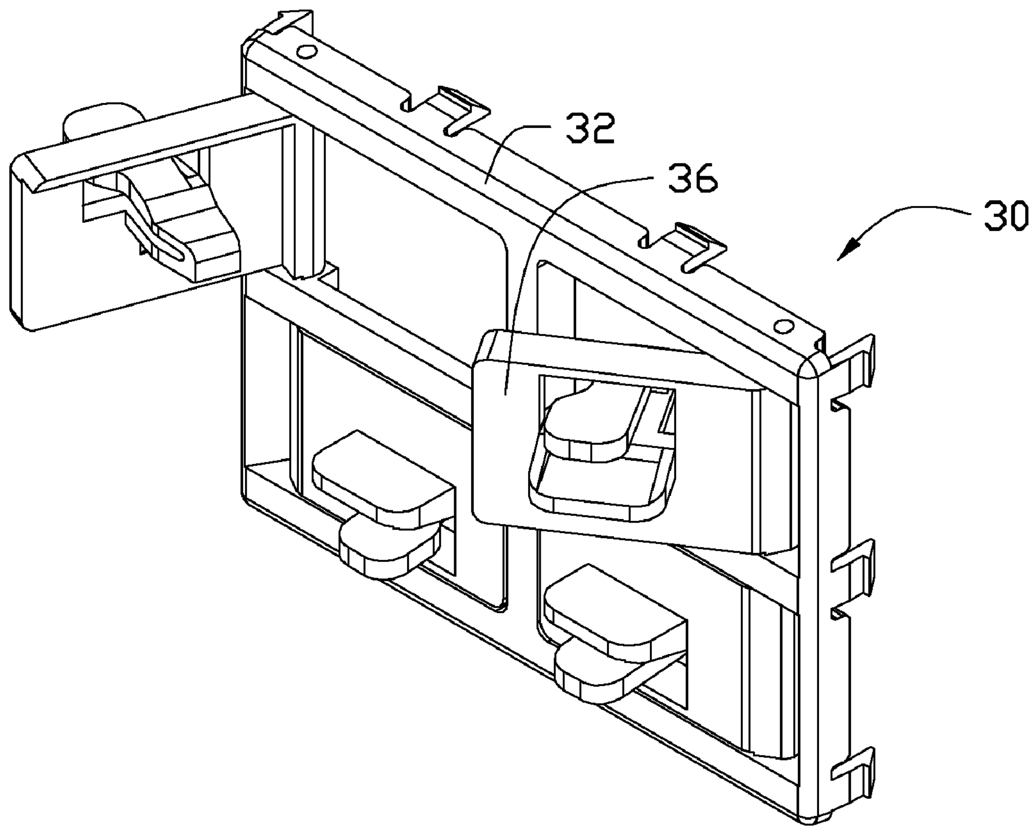
FIG. 3 is an enlarged view of the cover mechanism of FIG. 2, showing several covers in open states.
Figure 4:
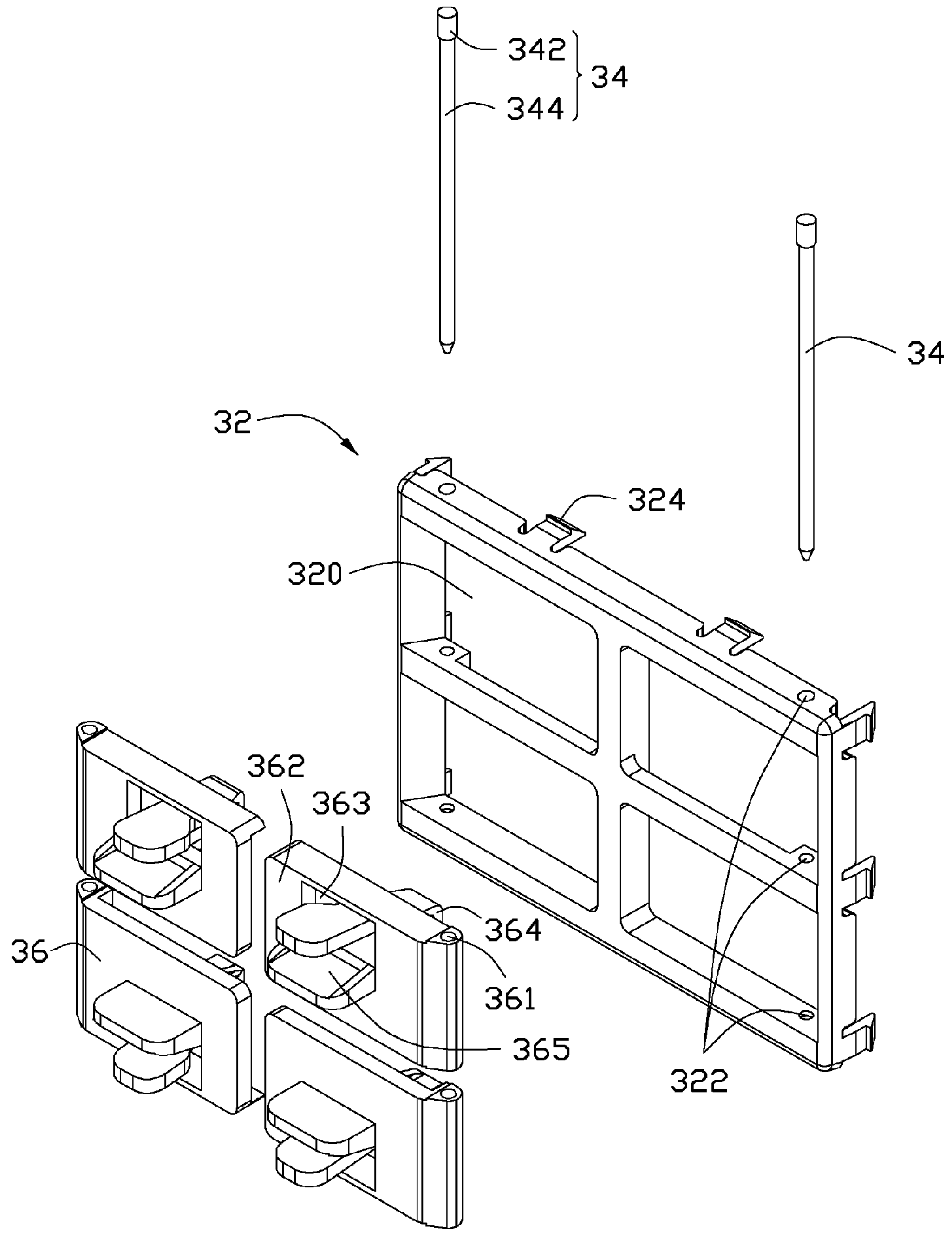
FIG. 4 is an exploded, isometric view of the cover mechanism of FIG. 2.
Figure 5:
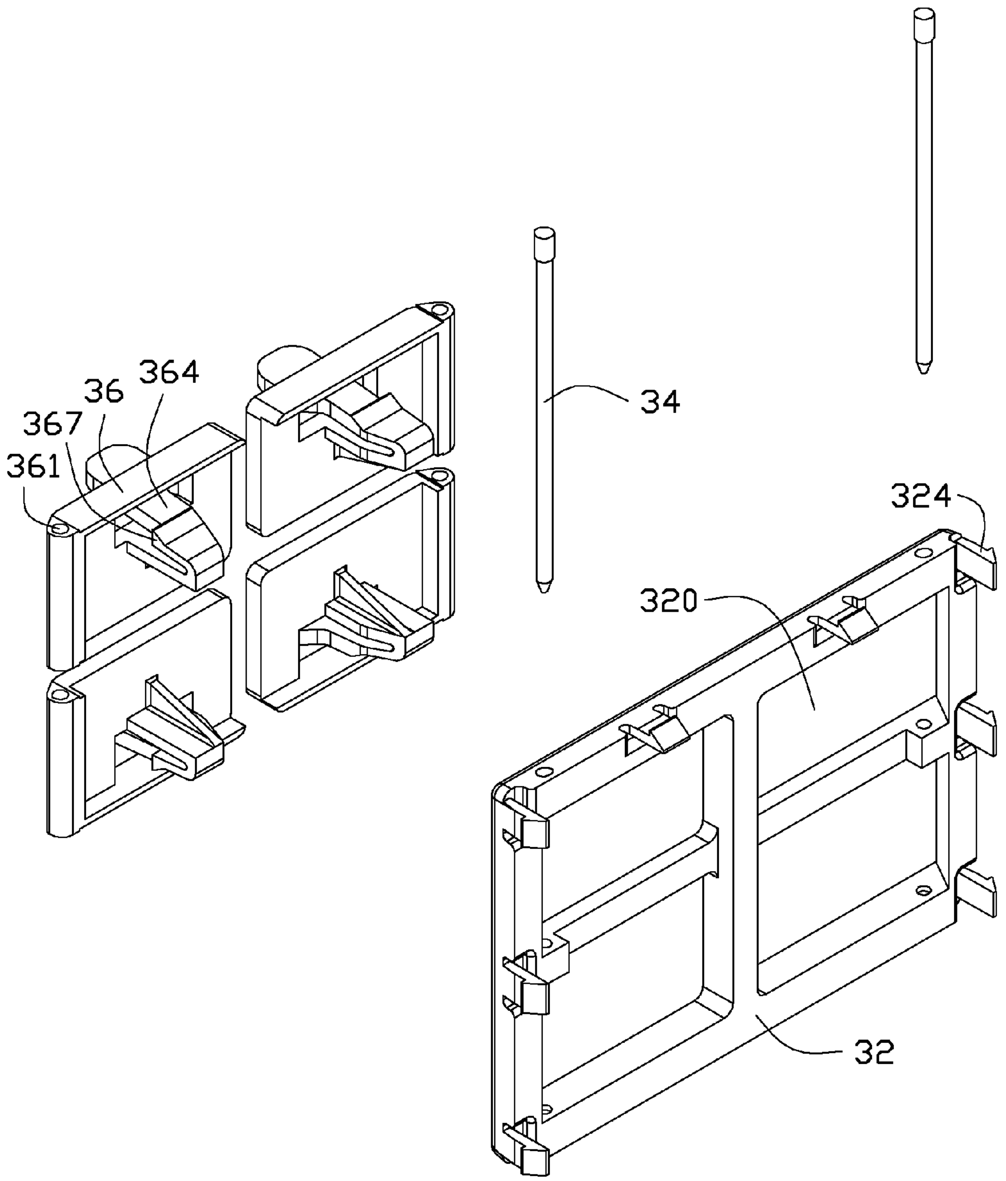
FIG. 5 is similar to FIG. 4, but viewed from another perspective.

Referring to FIGS. 3 to 5, the cover mechanism 30 includes a bracket 32, two pivot shafts 34, and a plurality of covers 36 pivotably mounted to the bracket 32 by the pivot shafts 34.

The bracket 32 defines a plurality of openings 320. In this embodiment, the bracket 32 defines four openings 320, and the cover mechanism 30 includes four covers 36 each covering a corresponding opening 320. The bracket 32 defines two through holes 322 in opposite ends of the bracket 32, each through hole 322 extends from a top to a bottom of the bracket 32 and communicates with two corresponding openings 320. A plurality of hooks 324 extend rearward from sides of the bracket 32.

Each cover 36 includes a covering body 362 and a substantially V-shaped elastic lock 364 extending from the covering body 362. The covering body 362 defines a through pivot hole 361 in an end of the covering body 362. The covering body 362 defines a through hole 363. An operation block 365 perpendicularly extends from a first side of the covering body 362, adjacent to each through hole 363 of the covering body 362. The elastic lock 364 extends from a second side of the covering body 362, opposite to the first side, and then extends back and through the through hole 363. A distal end of the elastic lock 364 faces the operation block 365. A wedge-shaped protrusion 367 extends from a middle portion of the elastic lock 364, opposite to the operation block 365 and facing the second side of the covering body 362.

Each pivot shaft 34 includes a pole 344 and a head 342 extending from a first end of the pivot shaft 34. The pole 344 of each pivot shaft 34 extends through the corresponding through hole 322 of the bracket 32 and the pivot holes 361 of the corresponding covers 36, therefore, the covers 36 are pivotably mounted to the bracket 32, to cover or uncover the corresponding openings 320.

Figure 6:
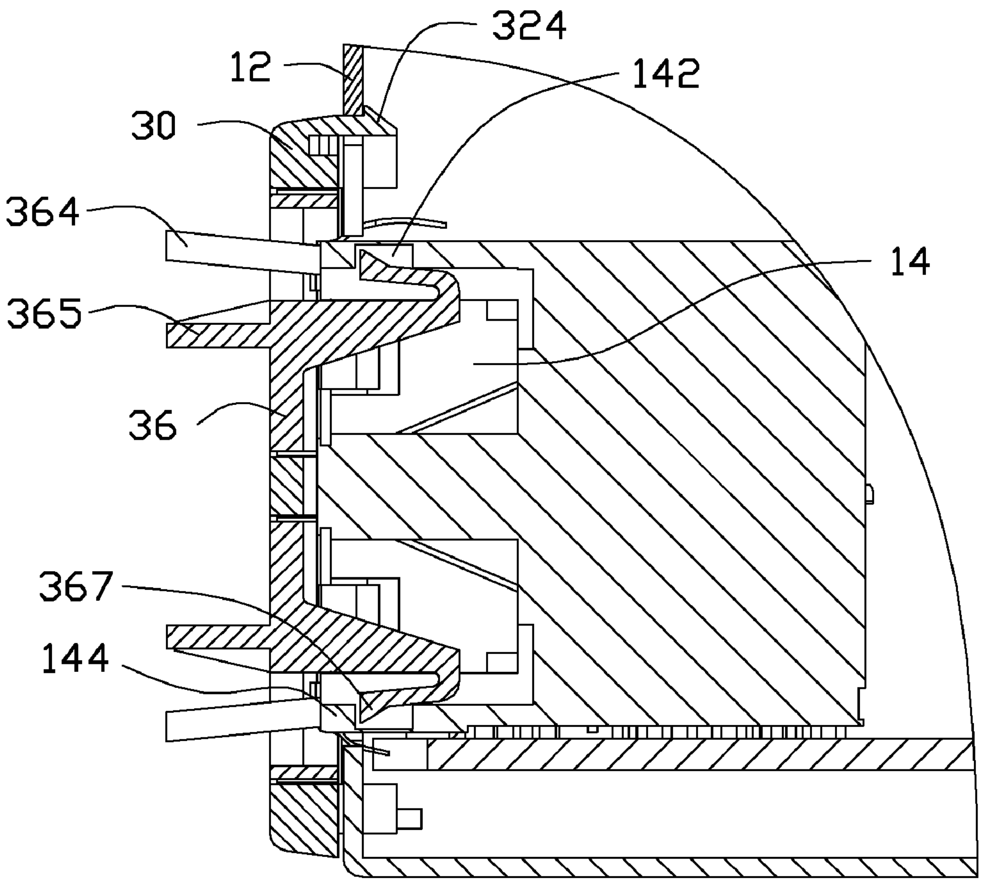
FIG. 6 is a cross-sectional view of the electronic apparatus of FIG. 1.

Referring to FIG. 6, to assemble the cover mechanism 30 to the enclosure 10, the hooks 324 of the cover mechanism 30 are engaged in the fixing holes 16 of the enclosure 10, with the openings 320 of the bracket 32 aligning with the corresponding connector ports 14 of the enclosure 10. To cover an opening 320, the covering body 362 of a corresponding cover 36 is rotated to cover the opening 320. The elastic lock 364 of the cover 36 is deformed, and partly extends through the slot 42 of a corresponding connector port 14. The elastic lock 364 then restores, thereby, the protrusion 367 of the lock 364 engages in the slot 142, and is locked by the blocks 144. Therefore, the cover 36 covers the connector port 14 of the enclosure 10, to prevent dust and/or moisture entering the connector port 14.

When one of the connector ports 14 needs to be used, the distal end of the elastic lock 364 of the corresponding cover 36 is urged towards the corresponding operation block 365, and the elastic lock 364 is deformed. In this state, the protrusion 367 of the elastic lock 364 disengages from the slot 142, and then, the cover 36 is rotated about the pivot shaft 34 to uncover the opening 320.

It is believed that the present embodiments and theirs advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. An electronic apparatus comprising:

an enclosure defining a connector port; and a cover mechanism comprising a bracket mounted to the enclosure, and a cover rotatably mounted to the bracket to cover or uncover the connector port, the cover comprising an elastic lock, wherein when the cover is rotated to cover the connector port, the elastic lock is engaged with a sidewall of the connector port;

wherein the cover defines a through hole extending through an inner surface of the cover facing the connector port and an outer surface of the cover opposite to the inner surface; the elastic lock extends from the inner surface of the cover to the connector port, and then extends back through the through hole to form a distal end exposed out of the outer surface of the cover opposite to the connector port, an operation block extends from the outer surface of the cover, facing the distal end of the elastic lock.

2. The electronic apparatus of claim 1, wherein two blocks extend from the sidewall of the connector port, with a slot defined between the blocks, a protrusion extends from the elastic lock, to engage in the slot.

3. The electronic apparatus of claim 1, wherein a protrusion extends from the elastic lock, opposite to the operation block, two blocks extend from the sidewall of the connector port, the protrusion is locked by the blocks.

4. The electronic apparatus of claim 1, wherein the bracket defines an opening aligning with the connector port, an end of the cover is pivotably mounted to the bracket by a shaft at an end of the opening, the cover is operable to cover the opening, thereby covering the connector port. through the through hole to form a distal end.

5. The electronic apparatus of claim 4, wherein the enclosure further defines a plurality of fixing holes surrounding the connector port, a plurality of hooks extend from the bracket to engage in the corresponding fixing holes.

6. A cover mechanism for protecting a connector port of an electronic apparatus, the cover mechanism comprising:

a bracket operable to be mounted to the electronic apparatus; and a cover mounted to the bracket to cover or uncover the connector port;

wherein the cover comprises an elastic lock, when the cover is rotated to cover the connector port, the elastic lock is engaged with a sidewall of the connector port; and wherein the cover defines a through hole extending through an inner surface of the cover facing the connector port and an outer surface of the cover opposite to the inner surface, the elastic lock extends from the inner surface of the cover to the connector port, and then extends back through the through hole to form a distal end exposed out of the outer surface of the cover opposite to the connector port, and operation block extends from the outer surface of the cover, facing the distal end of the elastic lock.

7. The cover mechanism of claim 6, wherein a protrusion extends from the elastic lock, adjacent to the distal end and opposite to the operation block, to engage with the sidewall of the connector port.

8. The cover mechanism of claim 6, wherein the bracket defines an opening aligning with the connector port, an end of the cover is pivotably mounted to the bracket by a shaft at an end of the opening, the cover is operable to cover the opening, thereby covering the connector port.

9. The cover mechanism of claim 8, wherein a plurality of hooks extend from the bracket to mount the bracket to the electronic apparatus.

* * * * *